United States Patent
Jiang et al.

[19]

[11] Patent Number: 5,960,712
[45] Date of Patent: Oct. 5, 1999

[54] SCREENS FOR USE IN A SCREEN PRINTING SYSTEM

[75] Inventors: Tongbi Jiang; Syed Sajid Ahmad, both of Boise, Id.

[73] Assignee: Mcron Technology, Inc., Boise, Id.

[21] Appl. No.: 09/005,935

[22] Filed: Jan. 12, 1998

[51] Int. Cl.⁶ ........................................... B41L 13/02
[52] U.S. Cl. .................. 101/129; 101/127; 101/127.1
[58] Field of Search ................... 101/115, 127, 101/127.1, 128.21, 128.4, 129

[56] References Cited

U.S. PATENT DOCUMENTS

| | | | |
|---|---|---|---|
| 4,223,602 | 9/1980 | Mitter | 101/128.21 |
| 4,262,084 | 4/1981 | Kinney | 430/308 |
| 4,497,848 | 2/1985 | Baran | 101/128.4 |
| 4,566,383 | 1/1986 | Matsushita et al. | 101/121 |
| 4,852,483 | 8/1989 | Bussard | 101/114 |
| 5,133,919 | 7/1992 | Hasegawa et al. | 101/114 |
| 5,334,815 | 8/1994 | MacNaughton et al. | 219/121.7 |
| 5,447,757 | 9/1995 | Cairncross et al. | 101/128.21 |
| 5,478,699 | 12/1995 | Blessington et al. | 101/127 |
| 5,686,525 | 11/1997 | Maruta et al. | 101/129 |
| 5,759,269 | 6/1998 | Cutting et al. | 101/126 |

FOREIGN PATENT DOCUMENTS 2090579  8/1993  Canada ................................ 101/127

OTHER PUBLICATIONS

Jennie S. Hwang, Solder Paste in Electronics Packaging, pp. 153–181 (1989).

*Primary Examiner*—Stephen R. Funk
*Attorney, Agent, or Firm*—Trop, Pruner, Hu & Miles, P.C.

[57] ABSTRACT

A disposable screen used in a screen printing system for printing onto electronic devices is formed of a non-metallic material. The screen is patterned from a foil. The material can be selected from a group consisting of plastic, nylon, paper, and resin. A disposable screen is mounted in the screen printing system, after which a paste material (including solder or an adhesive such as polyimide, bismaleimide, or a thermoset or thermoplastic compound) can be printed through the screen to a target structure. The used screen is discarded after one or more uses and a new screen is mounted in the screen printing system. A teaching sheet having a disposable transparent film is also used to set up the screen printing system. The film is detachably attached to a frame. After one or more prints, the used film is detached and replaced with a new film.

21 Claims, 4 Drawing Sheets

SCREENS FOR USE IN A SCREEN PRINTING SYSTEM

BACKGROUND

The invention relates to screens for use in a screen printing system for printing onto electronic devices.

Screen printing can be used for creating patterns on the surface of a target electronic structure, such as wafers, printed wiring boards (PWBs), multichip modules, and hybrid substrates. Screen printing machines also have other applications, such as use in printing ink onto various articles, including clothing, paper, etc.

The screens have predetermined patterns and form openings through which a paste material can be forced for deposition on a target surface underneath the screen. Three types of screens have been used: mesh or emulsion screens, rigid metal mask stencils, and flexible metal mesh stencils. The mesh or emulsion screen is made of wire mesh patterned by polymer emulsion. Stainless steel, polyester, and nylon are common materials for the wire in the mesh screen. Typically, the mesh screen is attached to a screen frame (which can be aluminum) under tension with a bonding adhesive.

The stencil (either metal mask stencil or flexible metal mesh stencil) is made from a solid metal foil that is chemically or laser etched to a desired pattern. The stencil is then attached to a frame. The metal foils are usually made of metallic materials such as brass, stainless steel, copper, beryllium copper, and nickel. For flexible metal mesh stencils, the foil is not directly bonded to the frame. Rather, a flexible mesh structure bridges the foil and is attached to the frame by adhesives.

After print cycles, the screen is cleaned to remove excess material. Typically, screens are cleaned by generally scraping and wiping the gross amount of paste off the screen, followed by rinsing the screen with proper solvents, which can include a trichloroethane/alcohol blend solvent or a freon-type solvent. Screen manufacturers, as well as printing paste manufacturers, sometimes recommend or supply cleaning solvents specially formulated for the screen. Cleaning systems available with screen printers typically clean only one side of the screen—the side on which the paste is applied or the opposite side (back of the screen).

Screen printing machines also use "teaching" sheets to determine if the screen printing assembly (including the mounted screen, the squeegee, and a test target substrate) is properly aligned. The teaching sheet includes a transparent film that is affixed to a frame. The teaching sheet is mounted over a test target substrate and loaded into the screen printing machine to perform test prints. Patterns printed onto the transparent film can then be analyzed to determine whether the machine is properly aligned. After each use, the teaching sheet is typically cleaned and re-used.

Typical cleaning techniques can remove most but not all of the printed materials, especially the material stuck to walls of apertures in the screen. As a result, traces of the printing material may be left on the screens or teaching sheets.

SUMMARY

The invention in one aspect is generally directed to use of screens in screen printing onto electronic devices in which the screen is formed by patterning a foil made of a metallic or non-metallic material. In another aspect, the invention is generally directed to use of a transparent film detachably attached to a frame, the film being used in test prints. The film can be detached from the screen after each use and replaced with a new film.

The invention has one or more of the following advantages. By using disposable screens or films, the screen or film cleaning step can be eliminated to reduce cost. In addition, by using a new screen or film for each screen printing step, the likelihood of residue materials existing on the screen or film is eliminated, which results in higher quality prints. Less costly patterning techniques (such as by pattern punching or laser cutting) exist that can pattern screens made of preselected materials.

In general, in one aspect, the invention features a screen printing system for printing onto electronic devices. A screen is formed by patterning a foil made of a nonmetallic material. A holder is configured to receive a target structure and to position the target structure underneath the screen. A member is adapted to apply a paste material through the screen to the target electronic device.

In general, in another aspect, the invention features a method of forming a material on a target electronic structure. A first screen is mounted in a screen printing system, and a paste material is printed through the first screen onto the target electronic structure. The used screen is removed after a predetermined number of prints and a new screen is mounted.

In general, in another aspect, the invention features a method of forming a paste material onto electronic devices. A screen is mounted in a screen printing system. The screen is formed from foil made of a non-metallic material. The foil is patterned to create predefined openings. A paste material is applied through the openings to an electronic device.

In general, in another aspect, the invention features a screen printing system including a screen, a target electronic structure positioned under the screen, and a teaching sheet mounted to cover the target structure. The teaching sheet includes a transparent film detachably attached to a frame.

In general, in another aspect, the invention features a method of setting up a screen printing machine used to print onto electronic devices. A teaching sheet is mounted over a target structure, the teaching sheet having a transparent film detachably attached to a frame. The teaching sheet is printed. The film is then detached from the frame after each use, and a new film is attached to the frame.

Other features and advantages will become apparent from the following description and from the claims.

DETAILED DESCRIPTION

Figure 1:
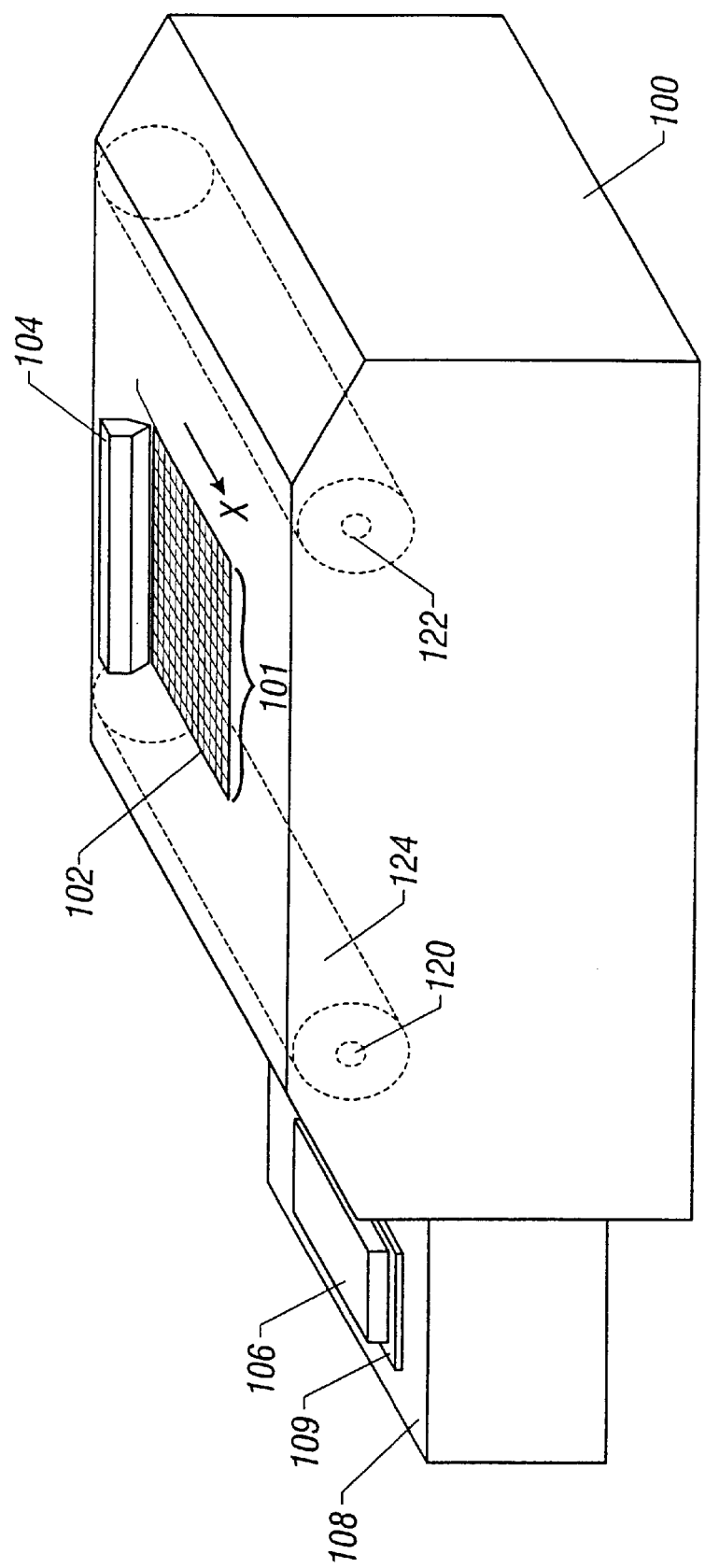
FIG. 1 is a perspective view of a screen printing machine.

Referring to FIG. 1, a screen printing machine 100 used to print to electronic devices includes a screen 102 and a squeegee 104. The screen 102 is made of a low cost material (discussed below) so that it can be discarded after each or a few uses and a new screen is used in its place for the next set of prints.

The squeegee assembly to which the squeegee 104 is attached is not shown. Typically, the squeegee assembly includes a squeegee holder and a squeegee driver to move the squeegee. The squeegee can be driven by pneumatic, electro-mechanic, or hydraulic power, which provide uniform and consistent speed during the printing process. The squeegee assembly also includes a squeegee pressure control mechanism and a squeegee height control mechanism to provide downstop and pressure regulation. During printing, the squeegee 104 is moved generally in the X direction to force paste through openings in the screen 102.

A target electronic structure 106 (e.g., a wafer, PWB, packages, or one of other support surfaces) is loaded on a holder 109 mounted on a loading surface 108 of the screen printing machine 100. The holder 109 is then loaded into the screen printing machine 100 to position the structure 106 under the screen 102 (under the processing area 101).

Figure 2A:
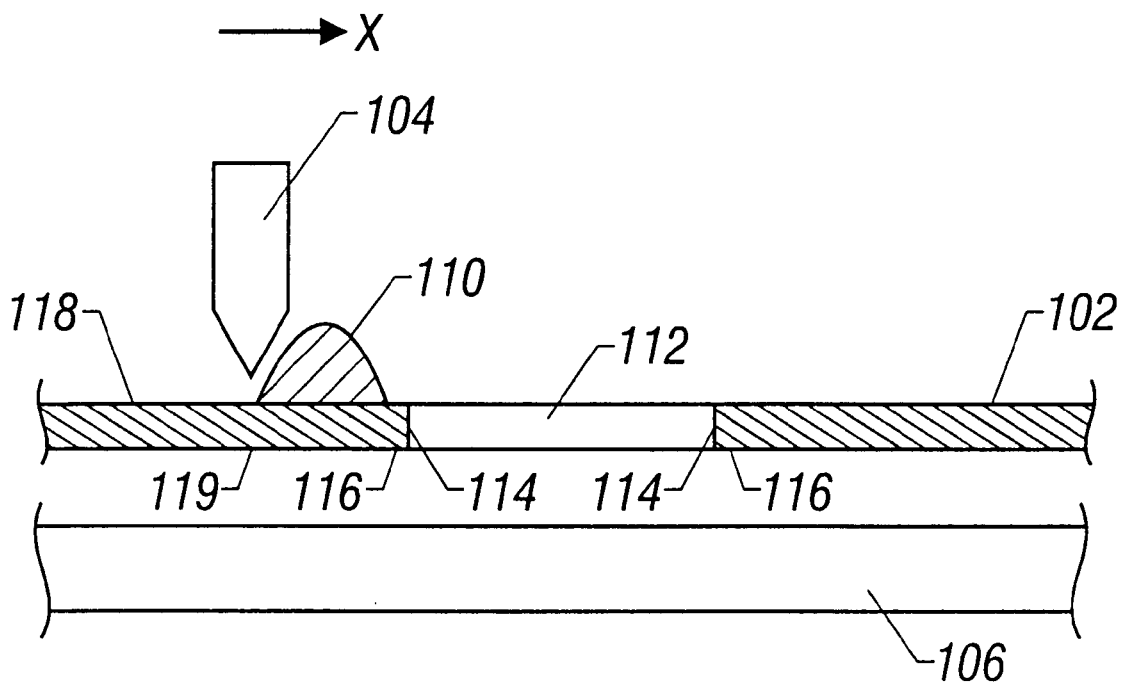
FIGS. 2A and 2B are enlarged, cross-sectional views of portions of the screen printing machine.
Figure 2B:
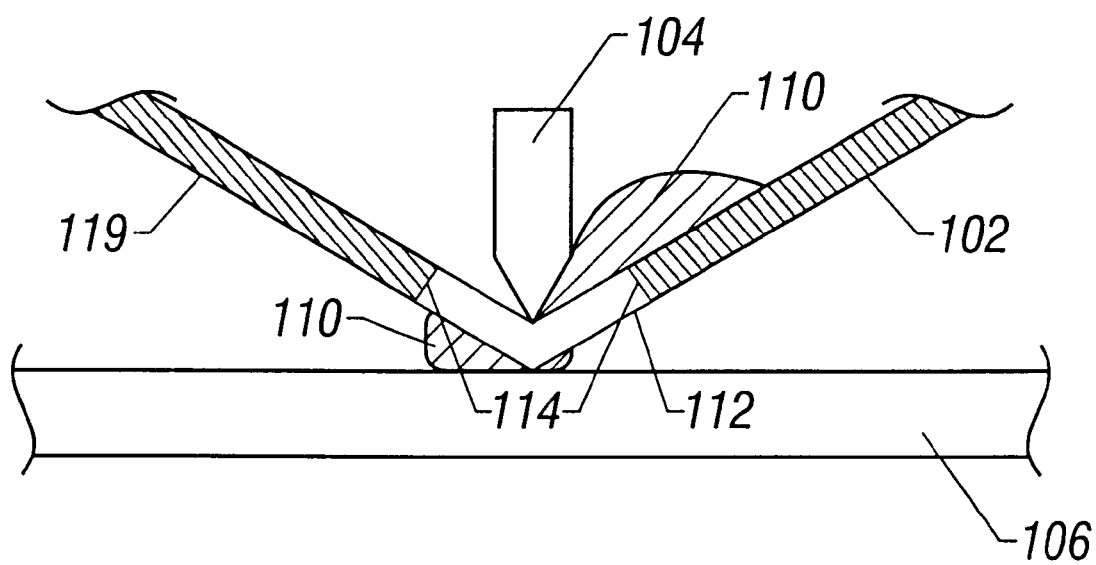

Referring to FIGS. 2A and 2B, a cross-sectional view of portions of the squeegee 104, paste 110, screen 102, and target structure 106 are shown. The paste 110 can be one of several exemplary materials, including adhesives such as polyimide, bismaleimide, epoxies, and other thermoset and thermoplastic compounds. Adhesives can be used to bound dies to leadframes in a lead-on-chip (LOC) package, to attach flip chips to an interconnecting substrate, or to attach packaged modules to an interconnecting substrate in a surface mount configuration. The paste 110 can also include solder. Generally, the paste 110 is in fluid form exhibiting a certain viscosity, e.g., greater than 5,000 centipoise (cps).

To apply the paste 110, it is placed on the upper surface 118 of the screen 102, which includes a body 116 having an opening 112. through which the paste 110 can be squeezed. As the squeegee 104 moves generally in the X direction, a downward pressure is applied (by the squeegee assembly) on the squeegee 104 to force the paste 110 downwardly. When the paste 110 is moved over the opening 112 of the screen 102, the motion of the squeegee 104 forces the paste 110 through the opening 112 and onto the surface of the substrate 106 underneath the opening 112. The downward pressure applied by the movement of the squeegee 104 causes the screen 102 to bend at or near the point of contact of the squeegee and the screen, as shown in FIG. 2B.

As a result of the screen printing process, paste residue may be left on the sidewalls 114 as well as on portions of the underside 119 of the screen 102. To avoid having to clean the screen 102, the screen 102 is made of a low cost material so that it is readily disposable. The material can include plastic (e.g., MYLAR polyester film, styrene), nylon, paper (which can be coated), or resin. The thickness of a plastic screen 102 can be in the range between about 1 mil and 10 mils. A solid foil made of the low cost material (which is relatively soft) can be patterned by using a pattern puncher to punch through the foil or by batch laser cutting, which are low cost patterning techniques.

After each or a few prints, the used screen can be discarded and replaced with a new one.

In an alternative embodiment, multiple disposable screens may be arranged in a continuous, long sheet that can be rolled up (to create a screen roll 124), as shown in FIG. 1. The roll 124 is mounted on a first roller 120 in the screen printing machine 100. The used screens of the screen roll 124 are received by a second roller 122 in the screen printing machine 100. Thus, during screen printing, the rollers 120 and 122 are rotated in a clockwise direction to move the old screen away from the processing area 101 and to move a new screen to the processing area. By using the roller configuration, old screens can be quickly removed from the processing area 101 and replaced with new screens.

Figure 3:
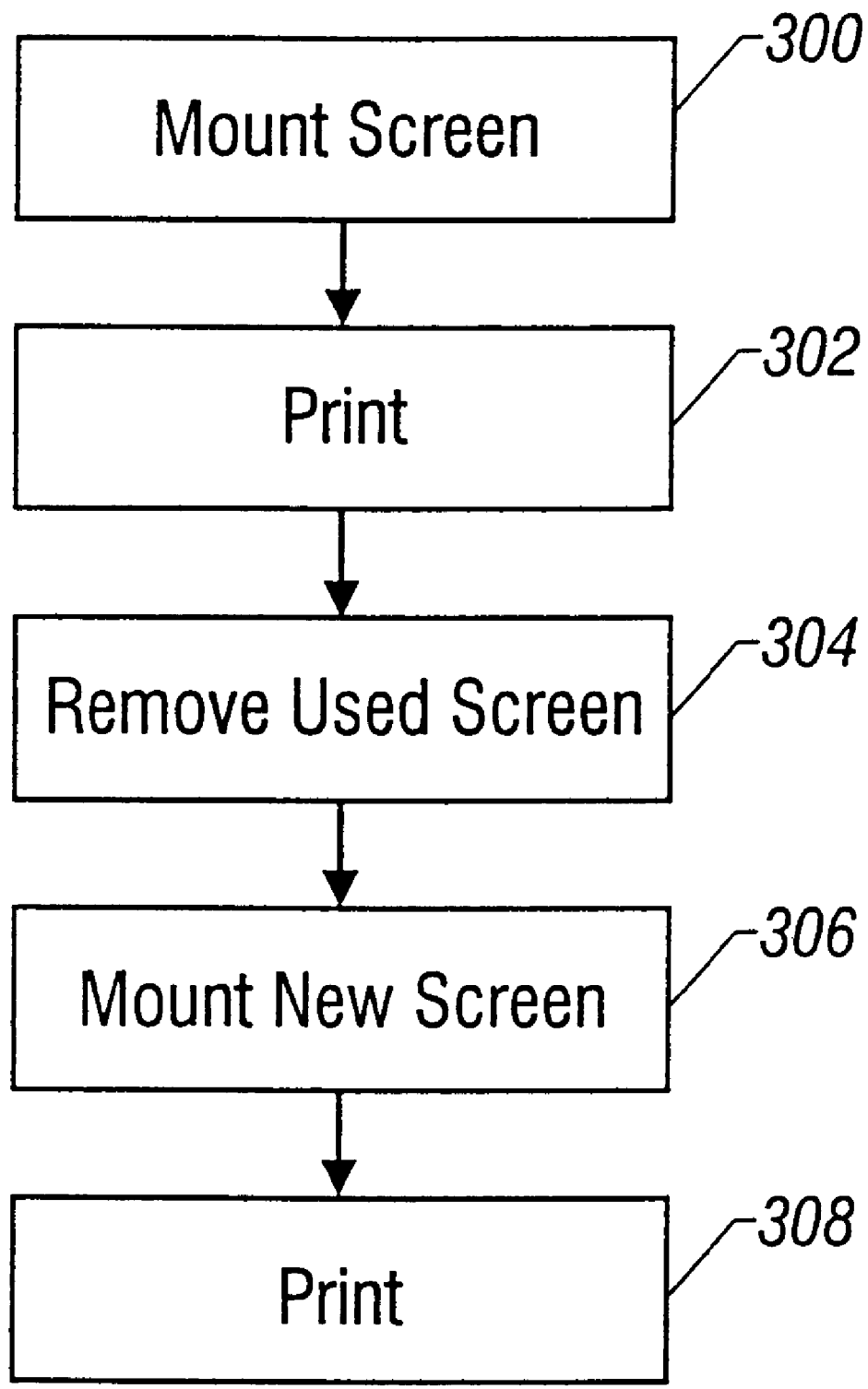
FIG. 3 is a flow diagram of a screen printing process.

The screen printing process using disposable screens is shown in FIG. 3. A screen is mounted in the screen printing machine (step 300), either as a single, discrete screen or as part of a roll of screens. After each print (step 302), or after a predetermined number (e.g., 2–10) of prints, the used screen is removed (step 304). If a single screen is used, the screen is removed from the screen printing machine 100 and a new screen mounted (step 306). If the roll configuration is used, the rollers 120 and 122 are rotated to move a new screen into the active area 101 (step 306). The next print operation can then be performed (step 308).

Use of disposable materials in a screen printing machine can also be extended to other applications. One such application involves using teaching sheets to determine if the screen printing assembly (including the mounted screen, the squeegee, and the target substrate) is properly aligned. The teaching sheet, typically affixed to a frame, is usually provided by the manufacturer. After each use, the teaching sheet is typically cleaned and re-used.

Figure 4:
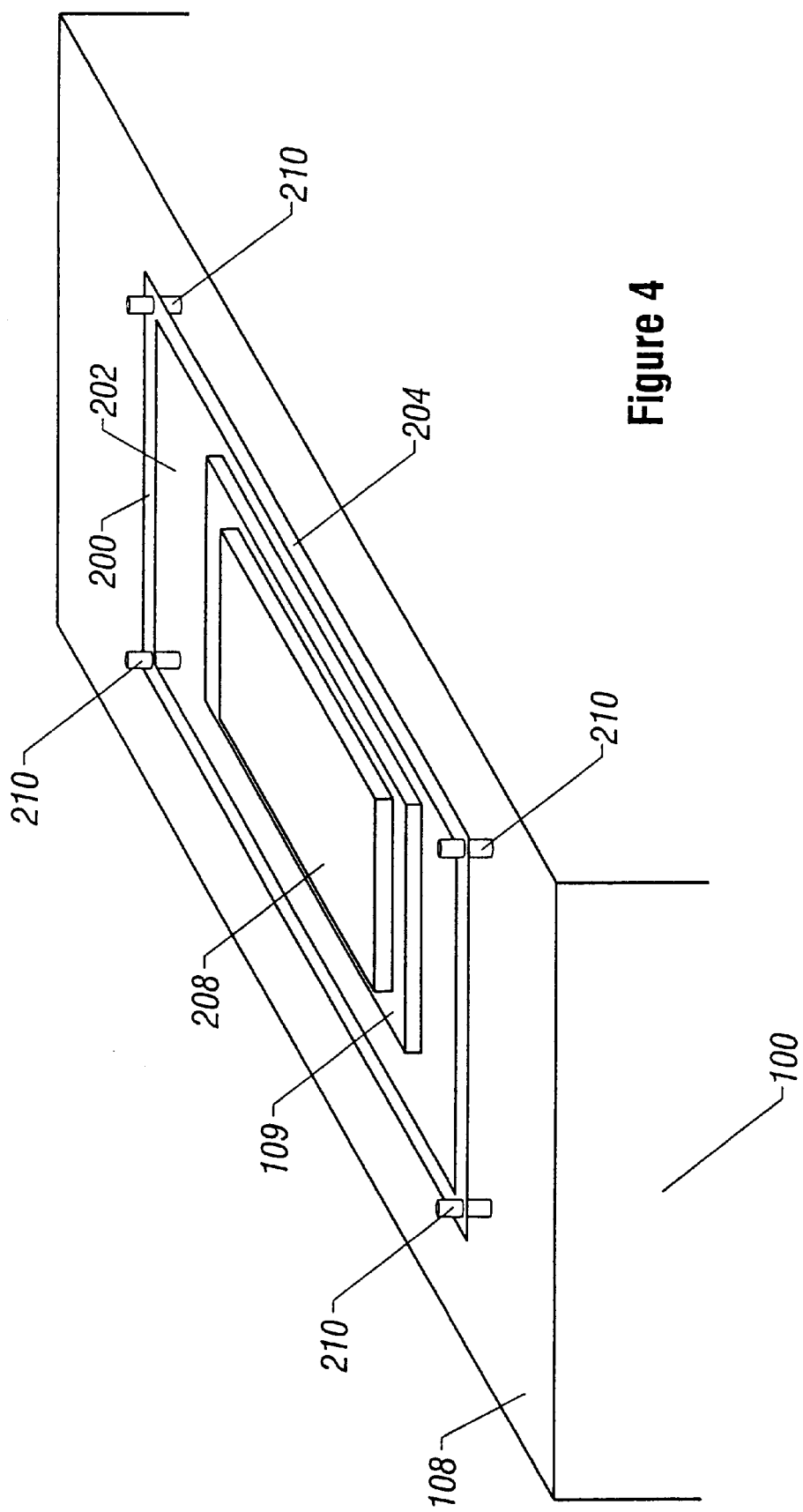
FIG. 4 is an enlarged, perspective view of a portion of the screen printing machine.

Referring to FIG. 4, the teaching sheet 204 includes a frame 200 to which a disposable transparent film of material 202 is detachably attached. The sheet 204 is mounted onto the loading surface 108 so that it covers a target structure 208 placed on the holder 109 of the screen printing machine 100. The frame 200 is attached to the loading surface 108 and over the target structure 208 by attaching members 210 (e.g., nuts and bolts).

After the holder 109 is loaded into the machine, paste is screen printed onto the teaching sheet 204. The pattern printed onto the teaching sheet 204 can then be analyzed to determine whether the machine is properly aligned. If not, the relative positions of the screen 102 and the holder 109 can be adjusted and the process repeated until the machine has been aligned.

To avoid having to clean the teaching film 202 after each use, the film 202 can be detached from the frame 200 after each use and replaced with a new film. The disposable film 202 can be made of plastic, nylon, paper, resin, or any other material with suitable transparency. The disposable teaching film 202 can be attached to the frame 200 using no-stick adhesive tape (e.g., no-stick SCOTCH adhesive tape) or other types of adhesive that allows easy removal of the disposable teaching film 202.

Other embodiments are within the scope of the following claims. Variations of the specific structures, components, and processes can be used. For example, other types of materials can be used for the screen or teaching sheet.

What is claimed is:

1. A method for use with a target electronic structure, comprising:

mounting a disposable screen having a predetermined pattern in a screen printing system;

printing a paste material through the disposable screen onto the target electronic structure; and removing the used disposable screen after ten or fewer prints and mounting, with a roller mechanism, a new screen having generally the same predetermined pattern in the screen printing system.

2. The method of claim 1, wherein the screen is removed after each print.

3. The method of claim 1, further comprising patterning a foil made of a non-metallic material to form the screen.

4. The method of claim 3, wherein the non-metallic material is selected from the group consisting of plastic, nylon, paper, and resin.

5. The method of claim 3, wherein the non-metallic material is selected from the group consisting of a polyester film, polyethylene, and styrene.

6. The method of claim 1, wherein the paste includes an adhesive.

7. The method of claim 1, wherein the paste includes a thermoset compound.

8. The method of claim 1, wherein the paste includes a thermoplastic compound.

9. The method of claim 1, wherein the paste includes polyimide.

10. The method of claim 1, wherein the paste includes bismaleimide.

11. The method of claim 1, wherein the paste includes solder.

12. The method of claim 1, wherein the paste exhibits a viscosity of greater than or equal to about 5,000 centipoise.

13. The method of claim 1, further comprising arranging a plurality of disposable sheets each having generally the same predetermined pattern on a first roller in the roller mechanism.

14. The method of claim 13, wherein removing the used disposable screen includes rotating the first roller and feeding the used disposable screen into a second roller.

15. A method of forming a paste material on electronic devices, comprising:

mounting a disposable screen in a screen printing system, the screen formed from a foil made of a non-metallic material, the foil having a first pattern with predefined openings:

applying the paste material through the openings to an electronic device; and removing the disposable screen by rotating a roller mechanism after ten or fewer applications of paste material and replacing it with a new screen having generally the first pattern.

16. The method of claim 15, wherein the non-metallic material is selected from the group consisting of plastic, paper, nylon and resin.

17. The method of claim 15, wherein the non-metallic material is selected from the group consisting of a polyester film, polyethylene, and styrene.

18. The method of claim 15, wherein the foil is patterned by pattern punching the foil.

19. The method of claim 15, wherein the foil is patterned by laser cutting the foil.

20. The method of claim 15, further comprising arranging a plurality of disposable screens each having generally the first pattern on a roller in the roller mechanism.

21. The method of claim 20, comprising rotating the roller to mount a new disposable screen.

* * * * *

UNITED STATES PATENT AND TRADEMARK OFFICE
CERTIFICATE OF CORRECTION

PATENT NO. : 5,960,712

DATED : October 5, 1999

INVENTOR(S) : Tongbi Jiang and Syed Sajid Ahmad

It is certified that error appears in the above-identified patent and that said Letters Patent is hereby corrected as shown below: On the title page: Item [73]
Change the Assignee from "Mcron Technology, Inc." to --Micron Technology, Inc.--

Signed and Sealed this

Fifteenth Day of August, 2000

Attest:

Q. TODD DICKINSON

Attesting Officer

Director of Patents and Trademarks